United States Patent [19]
Huggins

[11] Patent Number: 5,543,627
[45] Date of Patent: Aug. 6, 1996

[54] METHOD FOR MAXIMIZING THE SOLAR CELL OPTO-ELECTRONIC CONVERSION EFFICIENCY IN OPTICALLY CONTROLLED HYDRAULIC ACTUATORS

[75] Inventor: Raymond W. Huggins, Mercer Island, Wash.

[73] Assignee: The Boeing Company, Del.

[21] Appl. No.: 311,466

[22] Filed: Sep. 23, 1994

[51] Int. Cl.⁶ .................................................. G02B 27/00
[52] U.S. Cl. .................. 250/551; 250/221; 250/214 LS; 359/171; 327/47
[58] Field of Search ................................ 250/551, 221, 250/214 LS, 214 SG, 214 R; 359/171, 169, 147, 189, 191, 190, 142; 455/205; 327/47, 39; 315/153–158; 323/906–909, 369; 363/27, 140

[56] References Cited

U.S. PATENT DOCUMENTS

| | | | |
|---|---|---|---|
| 3,612,882 | 10/1971 | Sheppard | 250/208.4 |
| 4,132,378 | 1/1979 | Stevens | 244/175 |
| 4,306,314 | 12/1981 | Griffiths | 359/144 |
| 4,443,853 | 4/1984 | Maciolek et al. | 364/434 |
| 4,594,556 | 6/1986 | Ohta | 327/39 |
| 4,651,045 | 3/1987 | Wagner | 310/328 |
| 4,660,589 | 4/1987 | Bartholomew | 137/83 |
| 4,716,399 | 12/1987 | Nordlund | 250/234 |
| 4,742,678 | 5/1988 | Bartholomew et al. | 60/516 |
| 4,931,635 | 6/1990 | Toyama | 250/225 |
| 5,033,694 | 7/1991 | Sato | 244/78 |
| 5,044,155 | 9/1991 | Zimmerman | 60/224 |
| 5,085,125 | 2/1992 | Emo et al. | 91/459 |
| 5,301,053 | 4/1994 | Shikada | 359/191 |

Primary Examiner—Edward P. Westin
Assistant Examiner—Que T. Le

[57] ABSTRACT

A method for optically powering and controlling a hydraulic actuator in which the electrohydraulic servo valve is powered and controlled by a solar cell, with incident light at optimum level, but frequency-modulated at low amplitude, allowing optimum impedance matching to the servo valve solenoids. The signal is F.M. detected using a discriminator, which outputs are applied to the bases of two transistors in series with the electrohydraulic servo valve solenoids. The nearly constant output impedance of the solar cell or a follow-up amplifier allows optimum performance of the discriminator. The unique feature is the operation of the solar cell at a light level which is optimum for efficiency of the system.

1 Claim, 4 Drawing Sheets

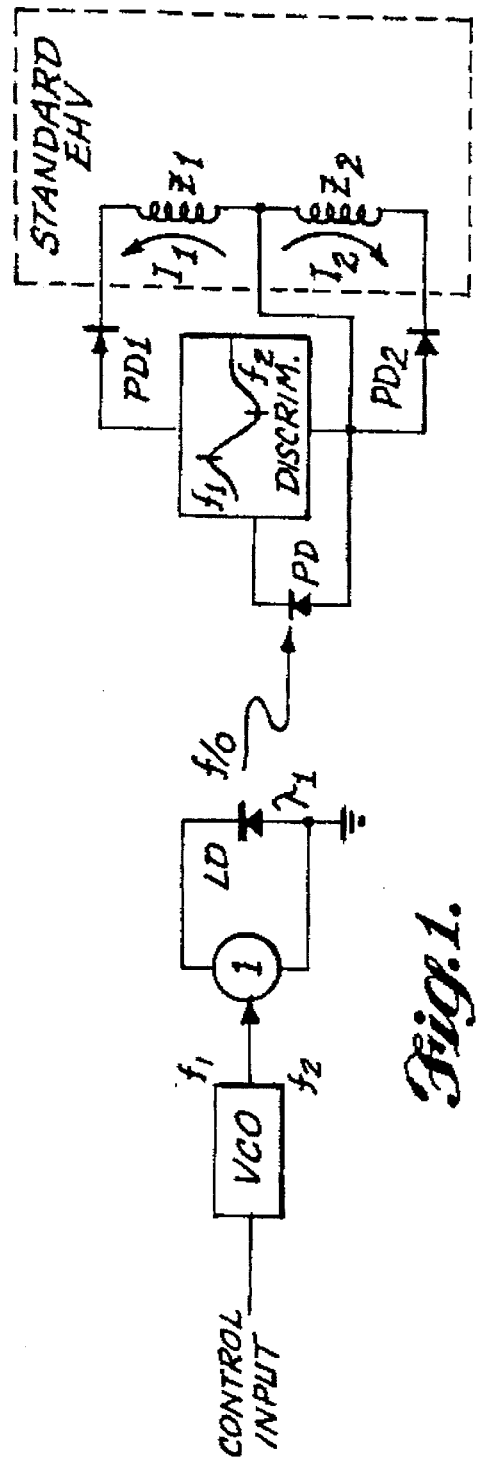
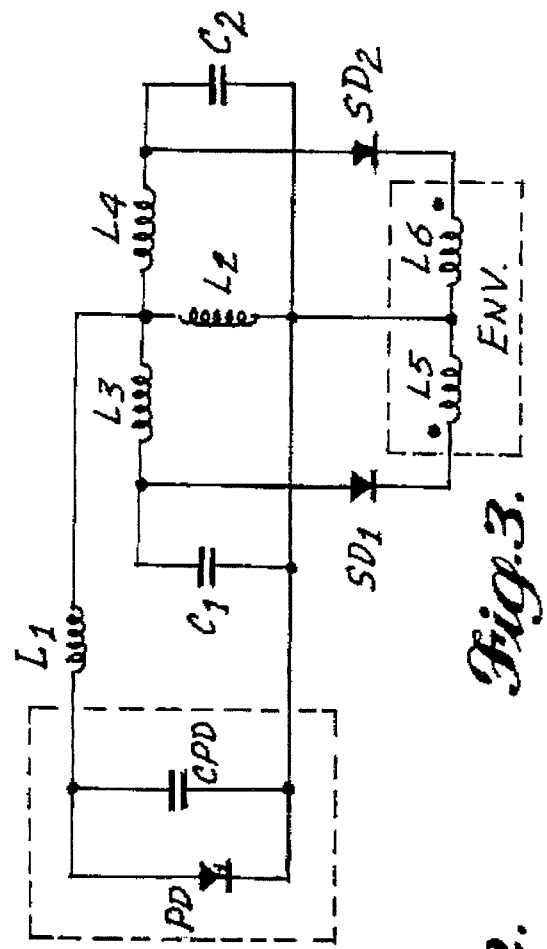
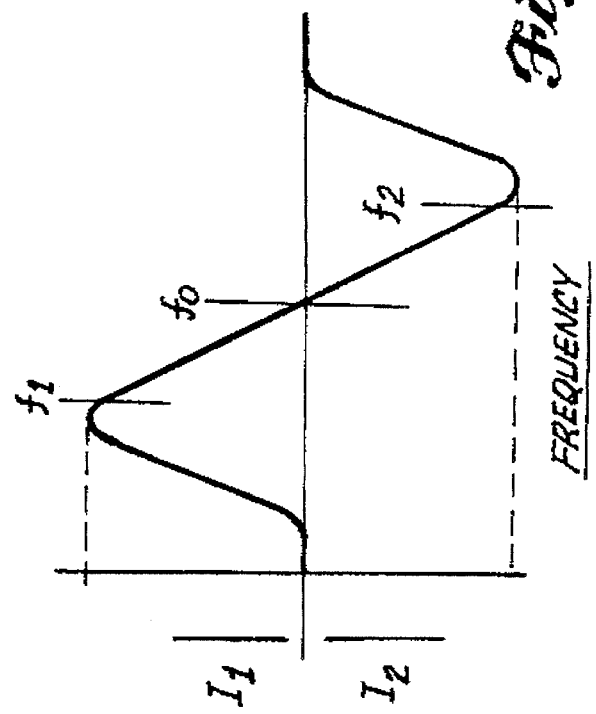

METHOD FOR MAXIMIZING THE SOLAR CELL OPTO-ELECTRONIC CONVERSION EFFICIENCY IN OPTICALLY CONTROLLED HYDRAULIC ACTUATORS

BACKGROUND OF THE INVENTION

A copending U.S. Pat. application Ser. No. 08/311,465, filed Sep. 23, 1994, title "Optically Controlled Actuator" by Glenn E. Miller describes a method for controlling an electrohydraulic control valve (EHV) using frequency modulated light transmitted along an optical fiber. While the method described works in principle, the present method is more efficient in terms of utilization of the available laser diode power. In this regard if the maximum CW laser power is $P_m$ Watts, and it is estimated that the power available may be as low as $P_m/10$ Watts. The only exception to this might be if the laser diode can be pulsed at much higher peak powers with reduced duty cycle. However, in the present application, the capacitance of the solar cells prevents operation at frequencies much above 30 KHz, and it is believed that pulse lengths must be reduced to a few microseconds before the peak power can be increased. Even then, the product of the peak power and the duty cycle will fall short of the maximum CW power. An embodiment of the present invention describes a method for increasing the utilization of the available CW laser power to up to at least 95% of $P_m$. This means that a reduced power laser diode will be required to power the EHV.

SUMMARY OF THE INVENTION

The present invention relates to a method for optically powering and controlling a hydraulic actuator in which the electrohydraulic servo valve is powered and controlled by light incident on a solar cell. The light incident on the solar cell has a high level DC component, with a low amplitude frequency modulated AC component superimposed on top of the DC component. The light intensity incident on the solar cell is therefore approximately constant thus allowing optimum impedance matching to the servo valve solenoids to maximize the solar cell opto-electronic conversion efficiency. Control of the electrohydraulic servo valve is affected by the low amplitude frequency modulated signal. The frequency modulated signal is F.M. detected using a discriminator, and the discriminator outputs are applied to the bases of two transistors in series with the electrohydraulic servo valve solenoids. This enables the servo valve solenoids to be controlled by the low level signal output from the discriminator. An optional gain stage may also be introduced to boost the voltage applied to the discriminator. The approximately constant output impedance of the solar cell of the amplifier allows optimum performance of the discriminator.

BRIEF DESCRIPTION OF THE DRAWINGS

The present invention is described hereafter in detail having reference to the drawings in which:

FIGS. 1, 2, and 3 correspond respectively to FIGS. 6, 7, and 8 of the application of Glenn E. Miller herein before identified;

DETAILED DESCRIPTION

Method of the system of FIG. 1, 2, and 3

FIG. 1, 2, and 3 correspond to FIG. 5, 6, 7 and 8 of the copending application of Glenn E. Miller with the description thereof associated therewith incorporated herein by reference. Inefficient utilization of the maximum available laser diode power arises for the following reasons.

Assuming that the laser diode power is sinusiodally modulated between 0 and $P_m$, the average power will be $P_m/2$.

Figure 4B:
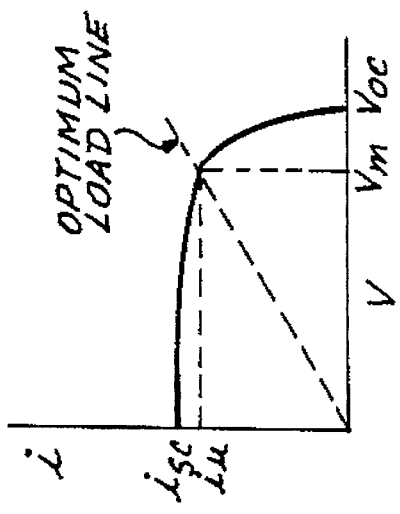
FIGS. 4A, 4B, 4C, and 4D are characteristic curves exemplary of solar cells.
Figure 4D:
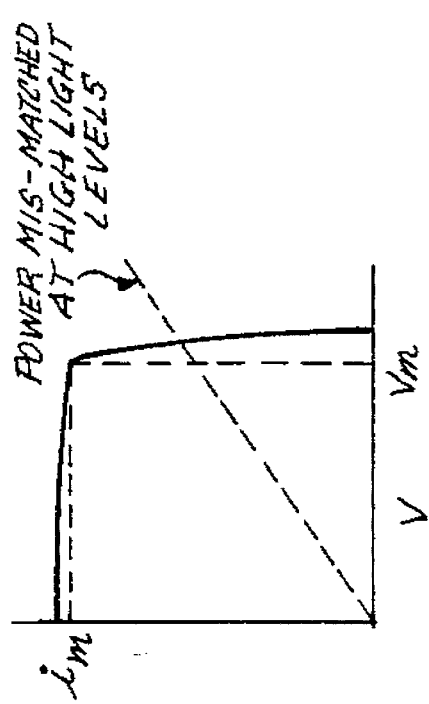
Figure 4A:
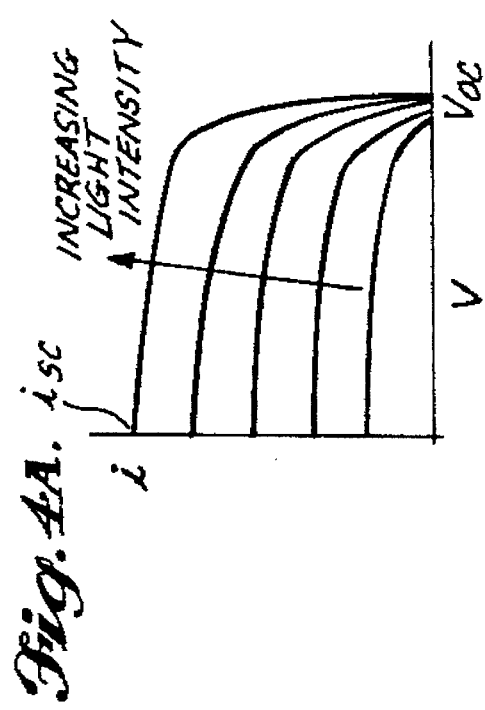
Figure 4C:
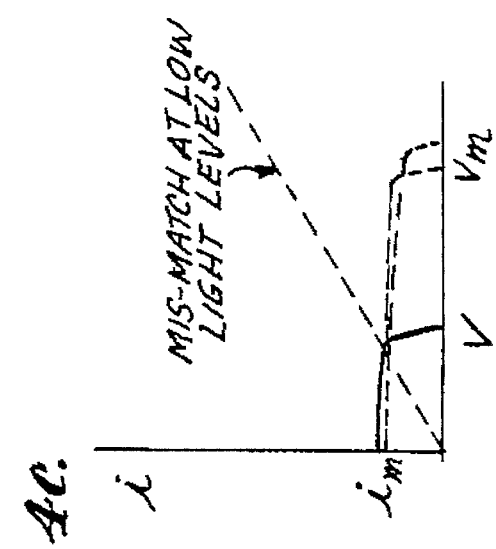

The current-voltage characteristic of the solar cell is highly non-linear, and is a function of the incident light energy. This means that a linear load will only be optimally matched at one particular light intensity. Hence, optimum coupling to the discriminator load will occur at only one point in the modulation cycle. Examples of solar cell characteristics are shown in FIG. 4A, B, C and D. It is conservatively estimated that a further inefficiency of at least a factor of 2, and probably more, will occur.

The voltage waveform applied to the discriminator will be highly distorted. If the frequency discriminator is to have reasonable discrimination characteristics, the loaded Q's of the series tuned circuits will have to be reasonable high. Power in the driving waveform at the higher harmonics of the modulation frequency will therefore be filtered out and be dissipated in the inductances.

Altogether, it is estimated that the average power applied to the EHV solenoids will be at the most, $P_m/5$. Finally, it is believed unlikely that the discriminator shown in FIG. 3 will produce the idealized characteristic shown in FIG. 2 because of the non linear source impedance of the solar cell.

PRESENT METHOD FOR IMPROVED AVAILABLE POWER UTILIZATION IN ACCORDANCE WITH THE PRESENT INVENTION

Figure 5:
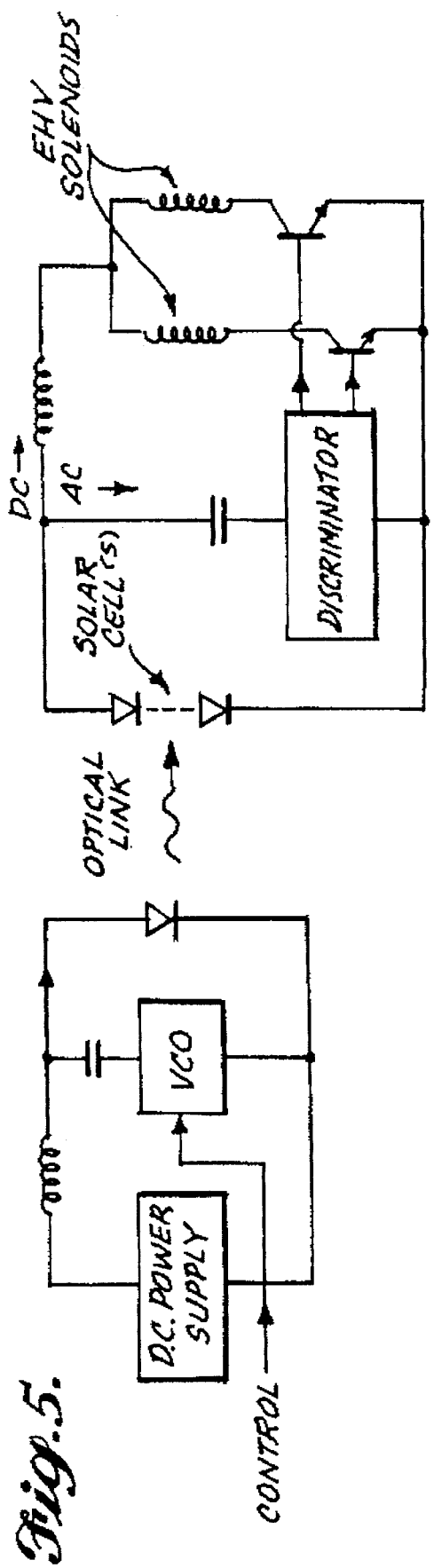
FIG. 5 is illustrative of a circuit schematic useful for increasing the utilization of available laser diode power in accordance with an embodiment of the present invention.
Figure 6:
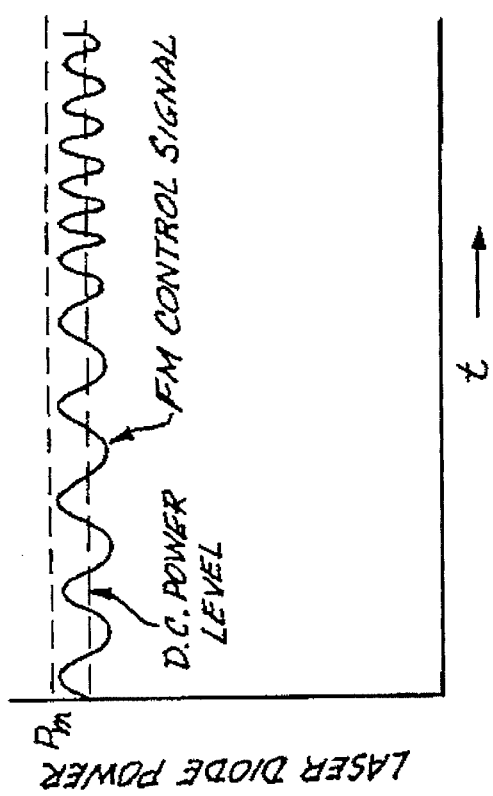
FIGS. 6 is illustrative of the intensity of laser output light as a function of time in accordance with the present invention.

The proposed method for increasing the utilization of the available laser diode power is shown schematically in FIG. 5. The laser diode is driven at a DC power level close to $P_m$, for example 95% $P_m$, and a low amplitude frequency modulated control signal is superimposed on the DC level such that the peak power does not exceed $P_m$. The intensity of the laser diode output light is shown as a function of time in FIG. 6. At the hydraulic actuator, the AC and DC components of the solar cell output power are separated. The DC component is applied to the two EHV solenoids each in series with a high beta or darlington transistor. The AC component is applied to a discriminator, and the two outputs of the discriminator used to control the series transistors. The high current gains of the transistors mean that low level discriminator outputs can control the solenoid currents. Advantages of this arrangement are:

The 50% reduction in the average power applied to the EHV because of the AC averaging is essentially eliminated Since the intensity of the light incident on the solar cell is approximately constant, the EHV solenoid impedance can be optimally matched to the solar cell.

As a result, at least 90% of the maximum laser diode power $P_m$ is available to power the EHV solenoids.

The approximately constant output impedance of the solar cell, and the fact that the discriminator does not have to match the solar cell impedance to the solenoid impedance powerwise mean that the discriminator can be designed to have the optimal characteristic shown in FIG. 2.

Figure 7A:
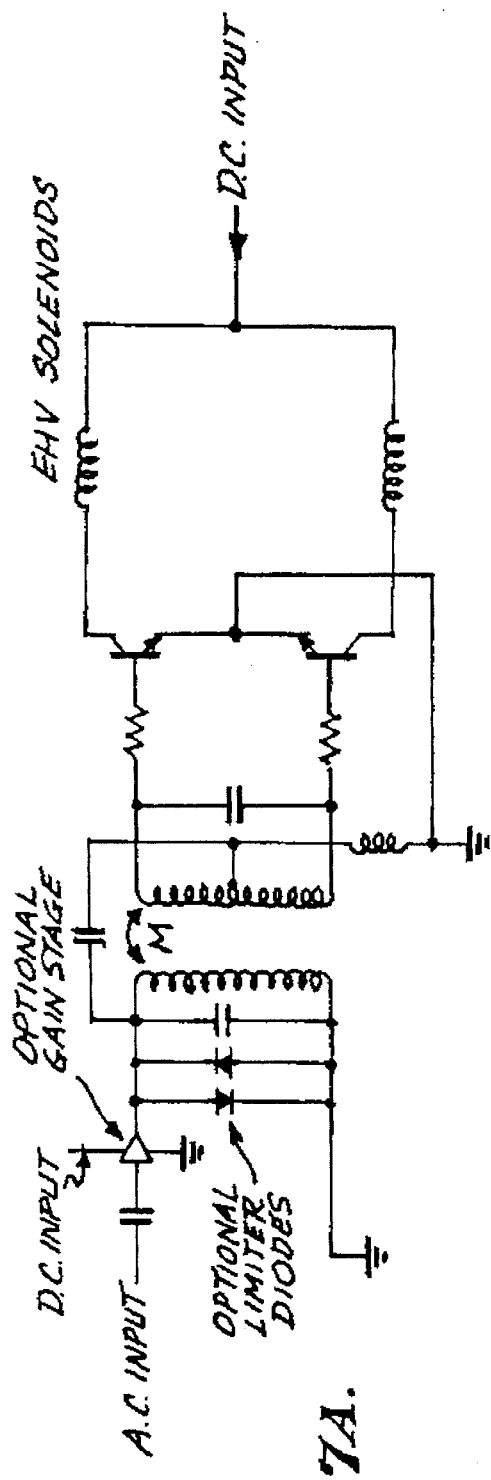
FIGS. 7A and 7B are illustrative of two phase discriminator detectors useful in the present system.
Figure 7B:
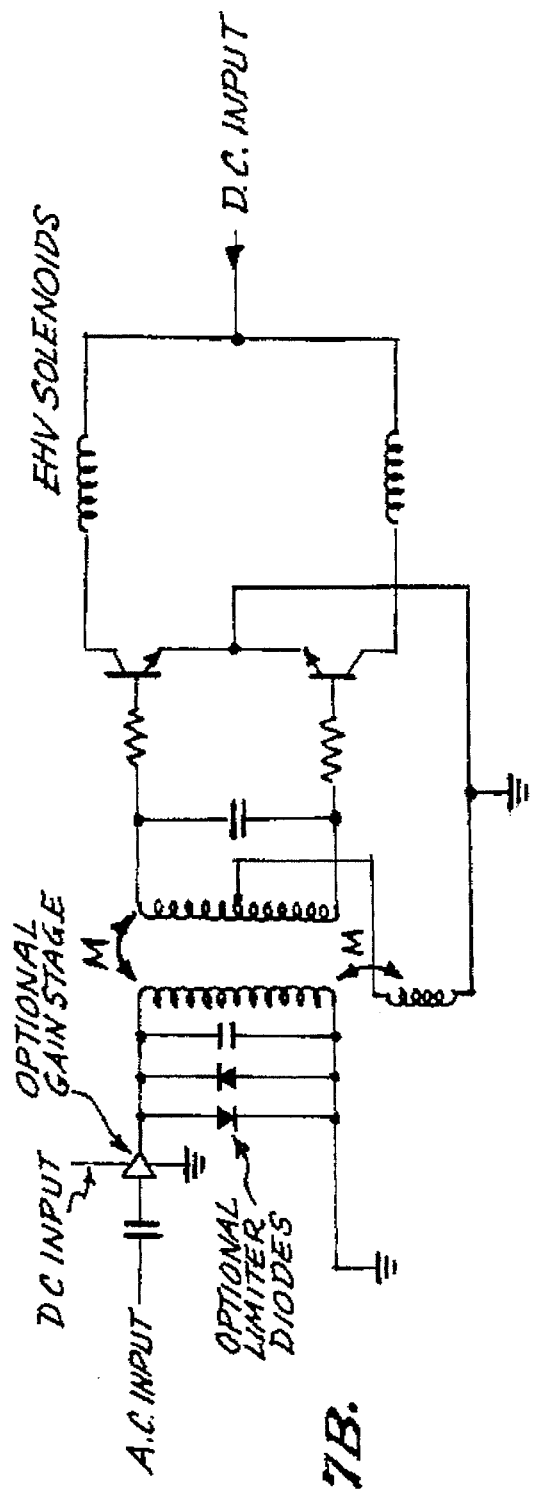

For the discriminator, a modified phase discriminator in which the usual diodes are replaced by transistors is suggested. The discriminator is shown in FIGS. 7A and 7B and operation relies upon the fact that at resonance, there is a 90 degree phase shift between the primary and secondary of the tuned transformer. If both the primary and secondary windings of the transformer are turned, the mutual inductance or coupling can be adjusted to give a fiat response over the desired frequency modulation range. Placing two diodes back to back across the primary winding of the transformer will reduce the dependence of the control signals on the any variable losses that might occur in the fiber link. Also, an optional gain stage may be introduced as shown. A more detailed discussion of the phase discriminator may be found in pages 1088–1095 of "Radiotron Designer's Handbook," 4th Edition pp. 1088–1095, Pub. Wireless Press, 1953; F. Langford Smith.

As a consequence of the preceding, those skilled in the art will appreciate the present improved method for optically controlling an electro-hydraulic servo valve using frequency modulation of the powering laser diode. The method relies upon the roughly constant light intensity incident on the solar cell resulting in an approximately constant source impedance for driving both the EHV solenoids, and the frequency discriminator. It is estimated that the maximum power of the laser diode could be reduced by up to an order of magnitude utilizing the present method and apparatus. In more detail, the light incident on the solar cell has a high level DC component, with a low amplitude frequency modulated AC component superimposed on top of the DC component. The light intensity incident on the solar cell is therefore approximately constant thus allowing optimum impedance matching to the servo valve solenoids to maximize the solar cell opto-electronic conversion efficiency. Control of the electrohydraulic servo valve is effected by the low amplitude frequency modulated signal. The frequency modulated signal is FM detected using a discriminator, and the discriminator outputs are applied to the bases of two transistors in series with the electrohydraulic servo valve solenoids. This enables the servo valve solenoids to be controlled by the low level signal output form the discriminator. An optional gain stage could also be introduced to boost the voltage applied to the discriminator. The approximately constant output impedance of the solar cell of the amplifier allows optimum performance of the discriminator.

What is claimed is:

1. A method of impedance matching a solar cell to servo valve solenoids including the steps of:

frequency modulation detecting a low amplitude frequency modulated signal from the solar cell utilizing a discriminator having a plurality of outputs; and, then applying output signals from the discriminator to the bases of two transistors respectively coupled in series with the servo valve solenoids.

\* \* \* \* \*